(12) United States Patent
Yano

(10) Patent No.: US 8,246,726 B2
(45) Date of Patent: Aug. 21, 2012

(54) VENTILATION MEMBER

(75) Inventor: Youzou Yano, Osaka (JP)

(73) Assignee: Nitto Denko Corporation, Osaka (JP)

( * ) Notice: Subject to any disclaimer, the term of this patent is extended or adjusted under 35 U.S.C. 154(b) by 176 days.

(21) Appl. No.: 12/935,494

(22) PCT Filed: Feb. 16, 2009

(86) PCT No.: PCT/JP2009/052507
§ 371 (c)(1),
(2), (4) Date: Sep. 29, 2010

(87) PCT Pub. No.: WO2009/122785
PCT Pub. Date: Oct. 8, 2009

(65) Prior Publication Data
US 2011/0016836 A1    Jan. 27, 2011

(30) Foreign Application Priority Data
Apr. 4, 2008   (JP) .................................. 2008-098418

(51) Int. Cl.
*B01D 53/22*   (2006.01)

(52) U.S. Cl. .......... 96/4; 55/385.4; 55/462; 55/DIG. 19; 123/41.86; 454/367

(58) Field of Classification Search ................. 55/385.4, 55/462, DIG. 19; 96/4; 123/41.86; 454/367
See application file for complete search history.

(56) References Cited

U.S. PATENT DOCUMENTS

| 4,401,093 | A | * | 8/1983 | Gates et al. .................... 123/573 |
| 4,993,517 | A | * | 2/1991 | Leipelt et al. .............. 184/105.1 |
| 5,129,371 | A | * | 7/1992 | Rosalik, Jr. ................. 123/90.38 |
| 7,678,169 | B1 | * | 3/2010 | Gwin et al. .................... 55/385.4 |
| 2005/0227610 | A1 | * | 10/2005 | Zukor et al. ................... 454/339 |
| 2009/0047890 | A1 |  | 2/2009 | Yano et al. |
| 2009/0084078 | A1 |  | 4/2009 | Furuyama et al. |

FOREIGN PATENT DOCUMENTS

| JP | 2004-22520 | 1/2004 |
| JP | 2007-87666 | 4/2007 |
| JP | 2007-87929 | 4/2007 |
| JP | 2007-141629 | 6/2007 |
| JP | 2004-266211 | 9/2009 |

* cited by examiner

*Primary Examiner* — Jason M Greene
*Assistant Examiner* — Anthony Shumate
(74) *Attorney, Agent, or Firm* — Hamre, Schumann, Mueller & Larson, P.C.

(57) ABSTRACT

A ventilation member (1A) includes: a gas permeable membrane (2); a support body (3) for supporting the gas permeable membrane (2); and a sealing element (4). The support body (3) has: a main portion (31) having a front surface (31a) on which the gas permeable membrane (2) is attached and a back surface (31b) for pressing the sealing element (4) against a housing (6); and a plurality of leg portions (32) to be inserted into an opening (61) and each having a hook (33) at its end. The main portion (31) has, at positions corresponding to the hooks (33) in the direction in which the leg portions (32) are inserted, through-holes (37) through which the hooks (33) are exposed as seen from the side of the front surface (31a) of the main portion (31).

11 Claims, 9 Drawing Sheets

VENTILATION MEMBER

This Application has priority to JP 2008-098418 and PCT/JP2009/052507.

TECHNICAL FIELD

The present invention relates to a ventilation member to be mounted to a housing.

BACKGROUND ART

Conventionally, in automotive electrical components such as lamps and ECUs (Electrical Control Units) for automobiles, OA (Office Automation) equipment, home appliances, medical devices, etc., an opening is formed in a housing for accommodating electronic parts, a control board, etc. to reduce the pressure fluctuation in the housing or to ventilate the housing, and a ventilation member is mounted in the position where the opening is formed. This ventilation member not only ensures ventilation between the inside and outside of the housing but also prevents foreign substances from entering the housing.

For example, JP 2007-141629 A discloses a ventilation member as shown in FIG. 9. This ventilation member includes: a support body 12 for closing an opening 14a of a housing 14 with a gas permeable membrane 11 when the support body 12 is fixed to the housing 14; a cover body 15 mounted on the support body 12 to cover the gas permeable membrane 11; and a sealing element 13 for sealing between the support body 12 and the housing 14 at a position surrounding the opening 14a.

Specifically, the support body 12 has a flange portion 12a and a cylindrical portion 12b. The gas permeable membrane 11 is attached to the front surface (upper surface in FIG. 9) of the flange portion 12a, and the back surface (lower surface in FIG. 9) thereof presses the sealing element 13 against the housing 14. The cylindrical portion 12b extends from the inner peripheral portion of the back surface of the flange portion 12a so as to be inserted into the opening 14a of the housing 14. Hooks 12c are formed on the edge of the cylindrical portion 12b and caught by the peripheral portion of the opening 14a from the inside of the housing 14.

The support body 12 shaped as mentioned above can be formed by, for example, injection molding. In this support body 12, however, the hooks 12c and the flange portion 12a overlap in the axial direction of the cylindrical portion 12b. Therefore, it is necessary for the injection molding to use both an axial die for forming the interior space of the cylindrical portion 12b and a pair of slide dies that can be separated from each other in the direction orthogonal to the axial direction of the axial die. In the injection molding using these axial die and slide dies, it is difficult to produce a large number of support bodies 12 at a time.

DISCLOSURE OF THE INVENTION

Under these circumstances, it is an object of the present invention to provide a ventilation member suitable for mass production.

In order to achieve the object, the present invention provides a ventilation member to be mounted to a housing, including: a gas permeable membrane; a support body for supporting the gas permeable membrane, the support body being configured to form a ventilation passage from an opening of the housing to the gas permeable membrane when the support body is fixed to the housing; and a sealing element for sealing between the housing and the support body at a position surrounding the opening. In this ventilation member, the support body includes: a main portion having a front surface on which the gas permeable membrane is attached and a back surface for pressing the sealing element against the housing; and a plurality of leg portions extending from the back surface of the main portion so that the leg portions can be inserted into the opening, the leg portions each having, at its end, a hook to be caught by the housing. The main portion has, at positions corresponding to the hooks in a direction in which the leg portions are inserted, through-holes through which the hooks are exposed as seen from a side of the front surface of the main portion, and the through-holes and gaps between the adjacent leg portions form the ventilation passage.

With such a configuration, the through-hole prevents the overlap of the main portion and each of the hooks in the direction in which the leg portions are inserted. This makes it possible, when the support body is produced, to use dies that can be separated in the insertion direction of the leg portions, that is, a die for forming the support body from the front surface side of the main portion and a die for forming the support body from the back surface side thereof. As a result, a large number of support bodies can be produced at a time. Thus, according to the present invention, a ventilation member suitable for mass production can be obtained.

BEST MODE FOR CARRYING OUT THE INVENTION

Hereinafter, embodiments of the present invention will be described with reference to the accompanying drawings.

First Embodiment

Figure 1:
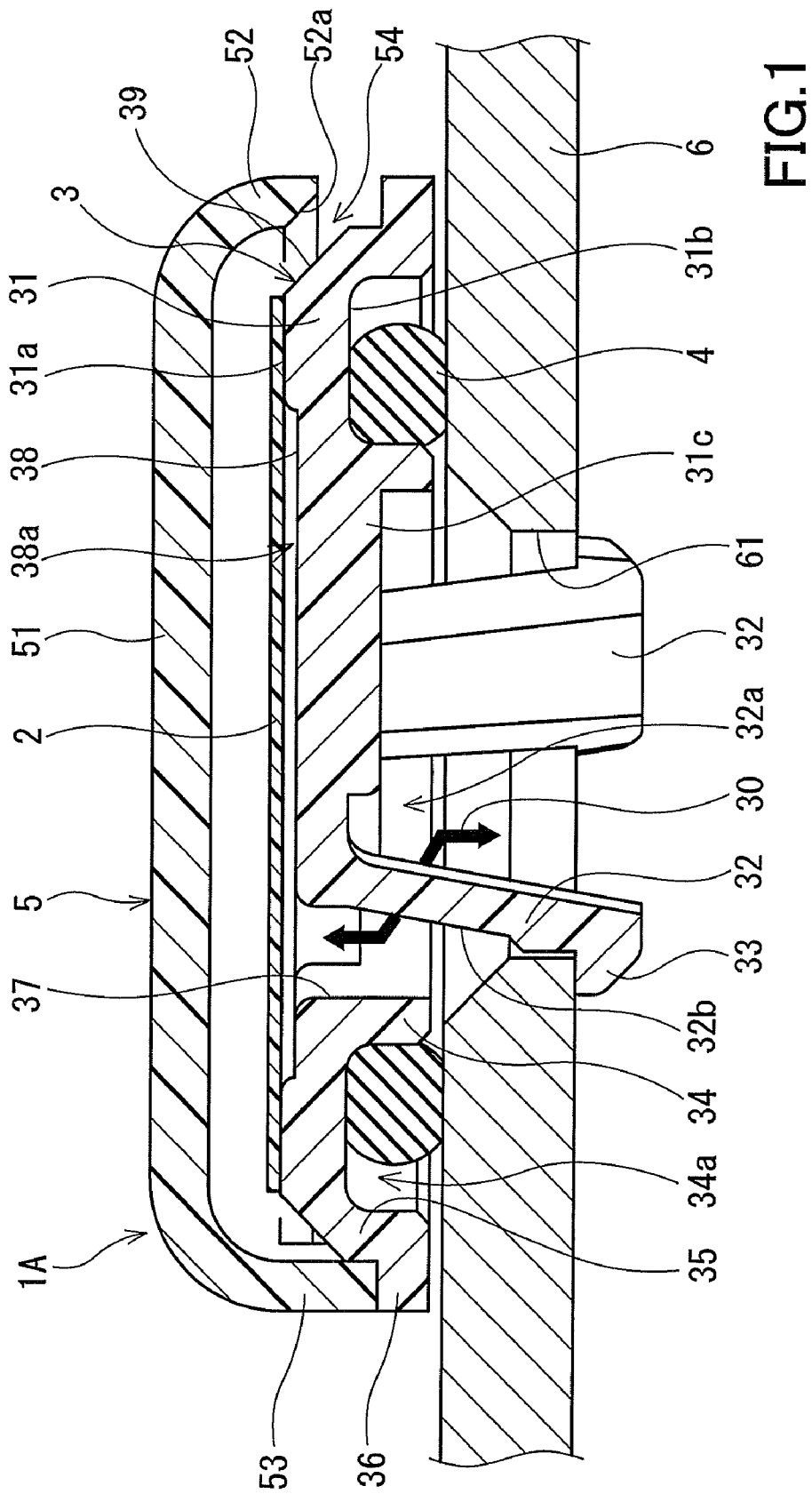
FIG. 1 is a cross-sectional view of a ventilation member according to a first embodiment of the present invention.

As shown in FIG. 1, a ventilation member 1A according to the first embodiment of the present invention is mounted in the position of a housing 6 where an opening 61 is formed. The ventilation member 1A includes a gas permeable membrane 2, a support body for supporting the gas permeable membrane 2, a sealing element 4 sandwiched between the support body 3 and the housing 6, and a cover body 5 for covering the gas permeable membrane 2 from the side opposite to the support body 3. The gas permeable membrane 2 has a function of blocking the entry of foreign substances such as water droplets and dust into the housing 6 while allowing gas to pass therethrough. The gas permeating action of the gas permeable membrane 2 maintains the pressures in and outside the housing 6 equal to each other. To simplify the description of the present embodiment, along the direction in which the support body 3 and the housing 6 sandwich the sealing element 4 therebetween, a direction toward the support body 3 (upper side in FIG. 1) is referred to as an upward direction, and a direction toward the housing 6 (lower side in FIG. 1) is referred to as a downward direction.

In the present embodiment, the opening 61 of the housing 6 is a circular through-hole penetrating through the housing 6 in the upward/downward direction. Preferably, the opening 61 is formed in a shape such that the diameter of its upper portion increases upwardly.

The structure and material of the gas permeable membrane 2 are not particularly limited as long as it is a membrane that allows gas to pass therethrough but blocks liquid from passing therethrough. For the gas permeable membrane 2, a membrane including a porous resin membrane can be used suitably. As a material for the porous resin membrane, a porous fluororesin material, a porous polyolefin material, or the like, that can be manufactured by a known drawing or extraction method. Examples of the fluororesin include PTFE (polytetrafluoroethylene), polychlorotrifluoroethylene, a tetrafluoroethylene-hexafluoropropylene copolymer, a tetrafluoroethylene-hexafluoropropylene copolymer, and a tetrafluoroethylene-ethylene copolymer. Examples of monomers in the polyolefin include ethylene, propylene, and 4-methylpentene-1,1-butene. It is possible to use a polyolefin obtained by polymerizing these monomers alone or copolymerizing these monomers. A porous nanofiber film material using polyacrylonitrile, nylon, and polylactic acid can be used as well. It is preferable to use, in particular, a porous PTFE material having high capability of blocking the entry of foreign substances into the housing 6 while ensuring ventilation with a small area.

The porous resin membrane may be subjected to a liquid repellent treatment depending on the intended use of the housing 6. The liquid repellent treatment can be carried out by applying a material having a low surface tension onto the porous resin membrane, followed by drying and then curing. It is only necessary for a liquid repellent agent used for the liquid repellent treatment to be capable of forming a coating layer having a surface tension lower than that of the porous resin membrane. For example, a liquid repellent agent containing a polymer having a perfluoroalkyl group is used suitably. The liquid repellent agent can be applied by means of immersion, spraying, and so forth. In terms of ensuring sufficient waterproof properties, it is preferable that the average pore size of the porous resin membrane be at least 0.01 μm but not more than 10 μm.

A reinforcement layer may be laminated to the porous resin membrane. This reinforcement layer imparts high strength to the gas permeable membrane 2. Preferably, the reinforcement layer has a higher gas permeability than the porous resin membrane. More specifically, woven fabric, non-woven fabric, mesh, net, sponge, foam, a porous material, and so forth made of resin or metal can be used as the reinforcement layer. The porous resin membrane and the reinforcement layer can be bonded to each other by adhesive lamination, heat lamination, heat welding, ultrasonic welding, or with the use of an adhesive.

By taking into consideration the strength and the ease of fixing to the support body 3, it is recommended to adjust the thickness of the gas permeable membrane 2, for example, in a range of 1 μm to 5 mm. The gas permeability of the gas permeable membrane 2 in Gurley value is preferably 0.1 to 300 sec/100 mL. In the present embodiment, the gas permeable membrane 2 is circular in shape. The shape of the gas permeable membrane 2 is not limited to this, and it may have a polygonal shape, for example.

Figure 2A:
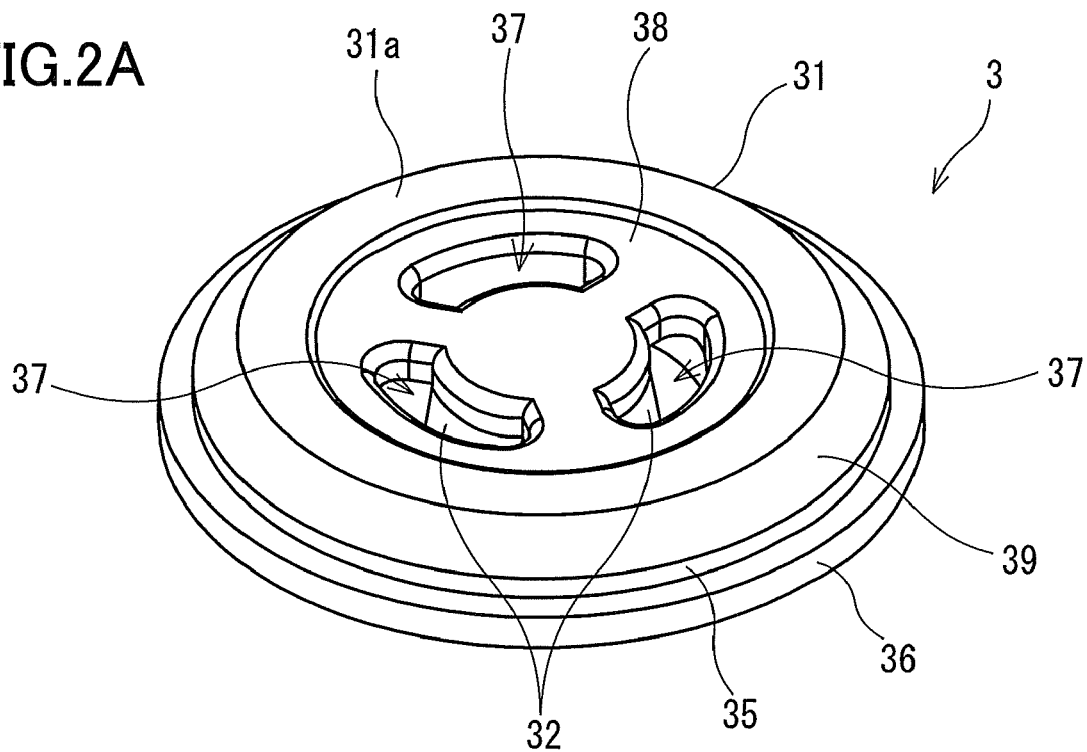
FIG. 2A is a perspective view of a support body of the first embodiment as seen from above.
Figure 2B:
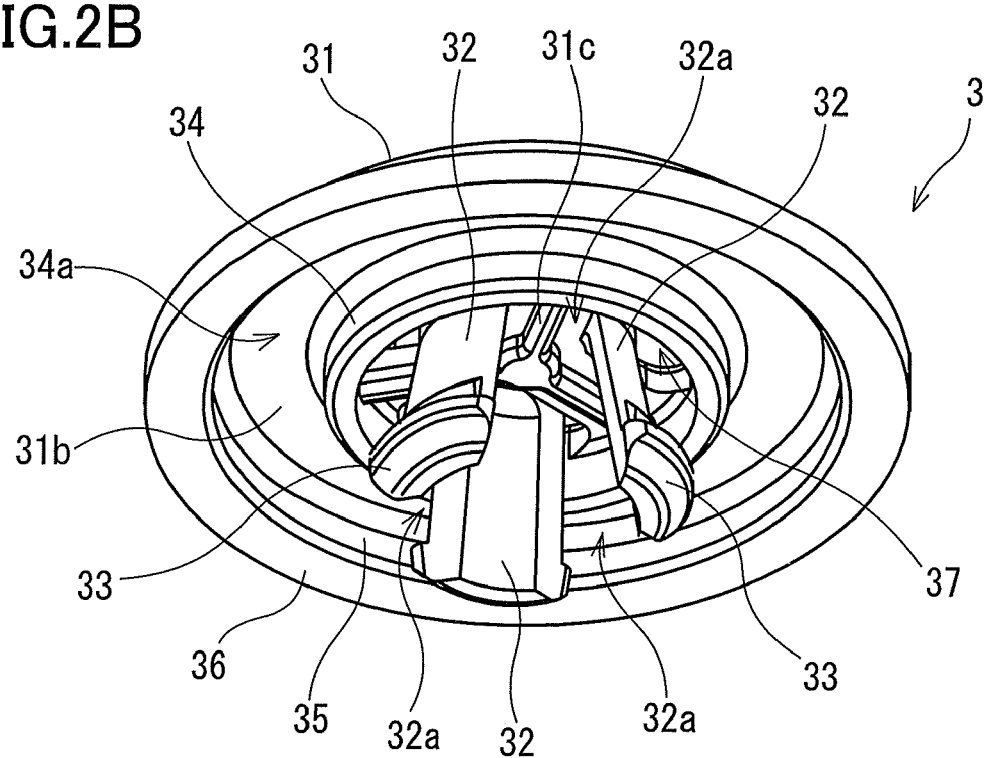
FIG. 2B is a perspective view of the support body as seen from below.

The support body 3 forms a ventilation passage 30 from the opening 61 of the housing 6 to the gas permeable membrane 2 when it is fixed to the housing 6. Specifically, as shown in FIG. 1 and FIGS. 2A and 2B, the support body 3 has a main portion 31 facing the surface of the housing 6, and a plurality of (three in the example shown in these diagrams) leg portions 32 extending downwardly from the main portion 31 so that they can be inserted into the opening 61 along the upward/downward direction.

The main portion 31 has a nearly circular plate shape squashed in the upward/downward direction. The main portion 31 has a front surface 31a facing upward and a back surface 31b facing downward. The gas permeable membrane 2 is attached to the front surface 31a. The gas permeable membrane 2 can be attached to the front surface 31a by heat welding, ultrasonic welding, or with the use of an adhesive. When the support body 2 is fixed to the housing 6, the sealing element 4 is pressed against the housing 6 by the back surface 31b. The shape of the main portion 31 may be changed appropriately to conform to the shape of the gas permeable membrane 2. It may be a polygonal plate shape, for example. Furthermore, the front surface 31a may be directed obliquely upward so that the thickness direction of the gas permeable membrane 2 is inclined.

More specifically, an area slightly smaller than the gas permeable membrane 2 on the front surface 31a is recessed downwardly to form a recess 38, which forms a space 38a between the front surface 31a and the gas permeable membrane 2. That is, only the peripheral portion of the gas permeable membrane 2 is attached to the front surface 31a. All of through-holes 37 to be described later open to the bottom of the recess 38. Preferably the depth of the recess 38 is at least 0.2 mm.

Furthermore, the front surface 31a has, at its peripheral portion that is the position surrounding the gas permeable membrane 2, a receding portion 39 receding toward the back surface 31b with increasing distance from the gas permeable membrane 2. That is, the main portion 31 has a plateau shape projecting upwardly. This shape makes it easier to remove foreign substances such as water droplets from the gas permeable membrane 2 even if they enter the inside of the cover body 5. In the present embodiment, the receding portion 39 is a tapered surface that is inclined downwardly outwardly in the radial direction. The receding portion 39 may have a shape such that it recedes stepwise toward the back surface 31b as it extends outwardly in the radial direction, or a shape such that it recedes toward the back surface 31b along a smooth curve.

The back surface 31b of the main portion 31 has: an outer peripheral wall portion 35 extending downwardly from the peripheral portion of the back surface 31b and surrounding the sealing element 4; and an inner peripheral wall portion (second peripheral wall portion) 34 extending downwardly from the back surface 31b so as to face the outer peripheral wall portion 35. This inner peripheral wall portion 34 forms an accommodation groove 34a for accommodating the sealing element 4 together with the outer peripheral wall portion 35 and the main portion 31.

The inner peripheral wall portion 34 has an inner diameter slightly smaller than the largest diameter of the opening 61 (the diameter of a portion of the opening 61 that opens on the surface of the housing 5) and an outer diameter slightly larger than the largest diameter of the opening 61. The sealing element 4 is held by the outer peripheral surface of the inner peripheral wall portion 34. The sealing element 4 may be held by the inner peripheral surface of the outer peripheral wall portion 35.

The sealing element 4 seals between the support body 3 and the housing 6 at a position surrounding the opening 61 of the housing 6. The sealing element 4 is an elastic element made of an elastomer such as NBR (nitrile rubber), EPDM (ethylene propylene rubber), silicone rubber, fluoride rubber, acrylic rubber, or hydrogenated nitrile rubber, a foam, or a foam with an adhesive layer. In the present embodiment, a sealing ring having a circular cross section is used. In FIG. 1, the sealing ring is pressed and deformed.

The outer peripheral wall portion 35 protects the sealing element 4 from the impact of external pressure. It is preferable that the height of the outer peripheral wall portion 35 be set so that the distance between the lower edge of the outer peripheral wall portion 35 and the surface of the housing 6 is 0.5 mm or less when the support body 3 is fixed to the housing 6.

Furthermore, a flange portion 36 projecting radially outwardly is formed on the lower edge of the outer peripheral surface of the outer peripheral wall portion 35. This flange portion 36 supports the cover body 5, and its projection width is approximately equal to the thickness of a side wall portion 52 of the cover body 5 to be described later.

The leg portions 32 are disposed at equal angular intervals in a circle, and extend obliquely downwardly from the back surface 31b of the main portion 31 so that they spread radially outwardly as the distance from the main portion 31 increases, that is as they extend in the downward direction. Each of the leg portions 32 has a circular arc-shaped cross section. At the end of each of the leg portions 32, a radially outwardly projecting hook 33 is provided on the outer surface 32b directed toward the back surface 31b of the main portion 31. These hooks 33 are caught by the peripheral portion of the opening 61 from the inside of the housing 6 when the leg portions 32 are inserted into the opening 61. More specifically, when the leg portions 32 are inserted into the opening 61 against the elastic force of the sealing element 4, the main portion 31 is biased upwardly by the restoring force of the sealing element 4. However, since the hooks 33 are caught, the leg portions 32 are prevented from slipping through the opening 61. Thus, the support body 3 is fixed to the housing 6. The projection width of each of the hooks 33 is set so that the hooks 33 are located within the circular area surrounded by the inner peripheral surface of the inner peripheral wall portion 34, as seen in the upward/downward direction.

Figure 3:
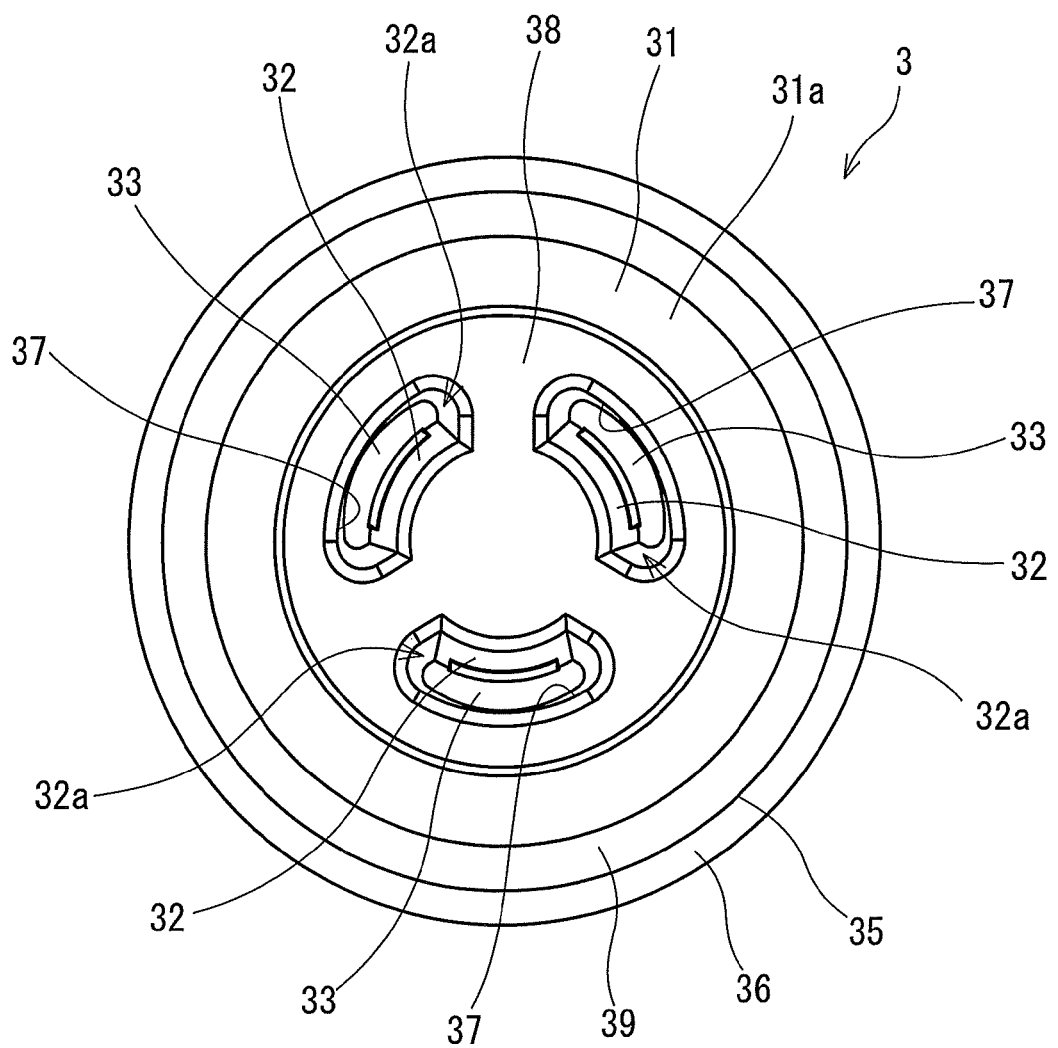
FIG. 3 is a plan view of the support body of the first embodiment.

Furthermore, as shown in FIG. 3, the main portion 31 has, at the positions corresponding to the hooks 33 in the upward/downward direction (the direction in which the leg portions 32 are inserted), through-holes 37 penetrating through the main portion 31 in the upward/downward direction. The size of the through-hole 37 is set to be larger than the projection geometry of the hook 33 as seen in the upward/downward direction. Specifically, each of the through-holes 37 has an approximately circular arc shape, and its width is equal to the distance from the base point on the outer surface 32b of the leg portion 32 (the point of intersection of the outer surface 32b and the back surface 31b of the main portion 31) to the inner peripheral surface of the inner peripheral wall portion 34. Therefore, the outer part of the inner peripheral surface of the through-hole 37 and the inner peripheral surface of the inner peripheral wall portion 34 form a continuous wall surface. The circumferential length of each of the through-holes 37 is slightly longer than that of the hook 33. Therefore, the hook 33 and the outer surface 32b of the leg portion 32 are exposed as seen from the side of the front surface 31a of the main portion 31 through the through-hole 37, and the main portion 31 does not overlap the hook 33 and the outer surface 32b of the leg portion 32 in the upward/downward direction.

As a result, the through-holes 37, the gaps 32a formed between the adjacent leg portions 32, and the space 38a formed by the recess 38 form the ventilation passage 30 from the opening 61 of the housing 6 to the gas permeable membrane 2. As stated herein, the gaps 32a are gaps for communicating the space surrounded by the leg portions 32 and facing the back surface 31b of the main portion 31 with the space surrounding the leg portions 32 and facing the back surface 31b of the main portion 31. To be more exact, the gaps 32a are gaps formed between the ends of the adjacent leg portions 32 in the width direction thereof (the circumferential direction in the present embodiment).

In the present embodiment, three ribs 31c extending from the center of the back surface 31b of the main portion 31 to the inner peripheral wall portion 34 through the intervals between the through-holes 37 are formed on the back surface 31b of the main portion 31.

The support body 3 having such a shape can be formed by common molding techniques, such as injection molding, compression molding, and powder molding, or cutting. In terms of mass productivity, injection molding is employed suitably. It is preferable to use a thermoplastic resin as the material for the support body 3 in view of moldability. Examples of the material include thermoplastic resins, such as PBT (polybutylene terephthalate), PA (nylon), and PET (polyethylene terephthalate), and thermoplastic elastomers, such as EPDM (ethylene propylene diene rubber) and silicone rubber. The material of the support body 3 may contain pigments, such as carbon black and titanium white, reinforcing fillers, such as glass particles and glass fibers, water repellent materials, and so forth. Furthermore, if the surface of the support body 3 is liquid repellent-treated, it removes liquid (water or oil) more easily even if it enters the inside of the cover body 5. The support body 3 may be subjected to other treatments, such as an adhesion promoting treatment, an insulating treatment, semiconductor treatment, and a conducting treatment.

Figure 4:
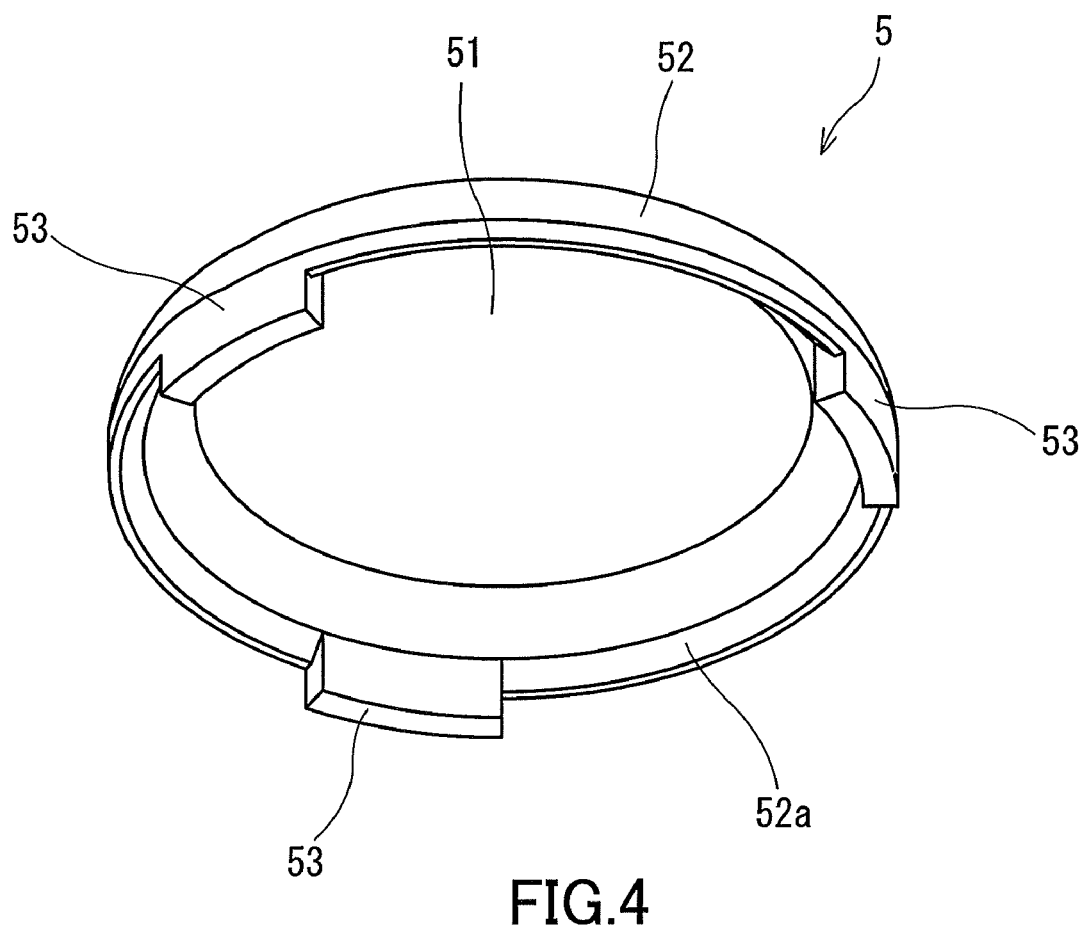
FIG. 4 is a perspective view of a cover body of the first embodiment.

As shown in FIG. 1 and FIG. 4, the cover body 5 has: a ceiling portion 51 facing the gas permeable membrane 2; a side wall portion 52 extending downwardly (in the direction toward the support body 3) from the peripheral portion of the ceiling portion 51; and a plurality of (three in the example shown in these diagrams) projecting portions 53 projecting downwardly (in the direction toward the support body 3) from the side wall portion 52. This cover body 5 can be formed integrally with the ceiling portion 51, the side wall portion 52, and the projecting portions 53, as a single unit, by a known method such as injection molding using the same material as used for the support body 3.

The ceiling portion 51 has a nearly circular plate shape squashed in the upward/downward direction, and its peripheral portion is curved downwardly to lead to the side wall portion 52 smoothly. The side wall portion 52 has an inner diameter approximately equal to the outer diameter of the outer peripheral wall portion 35 of the support body 3.

The projecting portions 53 are disposed at equal angular intervals, and have a shape of the side wall portion 52 extended further downwardly. The lower edge of each of the projecting portions 53 is fixed to the corner portion formed by the outer peripheral surface of the outer peripheral wall portion 25 of the support body 3 and the upper surface of the flange portion 36. The projecting portions 53 form a gap 54 between the side wall portion 52 and the support body 3, through which the space defined inside the cover body 5 along the gas permeable membrane 2 communicates with the outside. The projecting portions 53 can be fixed to the support body 3 by the use of an engagement structure, by bonding with an adhesive, ultrasonic welding, etc.

The projection height of the projecting portions 53 is set so that the side wall portion 52 extends beyond the gas permeable membrane 2 in the direction toward the support body 3. It is preferable that the height from the lower edge surface of the side wall portion 52 to the lower surface of the gas permeable membrane 2 be at least 0.2 mm.

The side wall portion 52 has, on the lower edge of its inner peripheral surface, an inclined surface 52a parallel to the receding portion 39 of the support body 3. With such a shape, the gap 54 is increased so that foreign substances that have entered the inside of the cover body 5 can be discharged smoothly to the outside.

As described above, in the ventilation member 1A of the present embodiment, the through-hole 37 prevents the main portion 31 from overlapping the hook 33 and the outer surface 32b of the catch portion 32 in the upward/downward direction. This makes it possible, when the support member 3 is produced, to use dies that are separated in the upward/downward direction, that is, a die for forming the support member 3 from the side of the front surface 31a of the main portion 3 and a die for forming the support member 3 from the side of the back surface 31b thereof. As a result, a large number of support bodies 3 can be produced at a time. Thus, according to the present embodiment, the ventilation member 1A suitable for mass production can be obtained.

Figure 9:
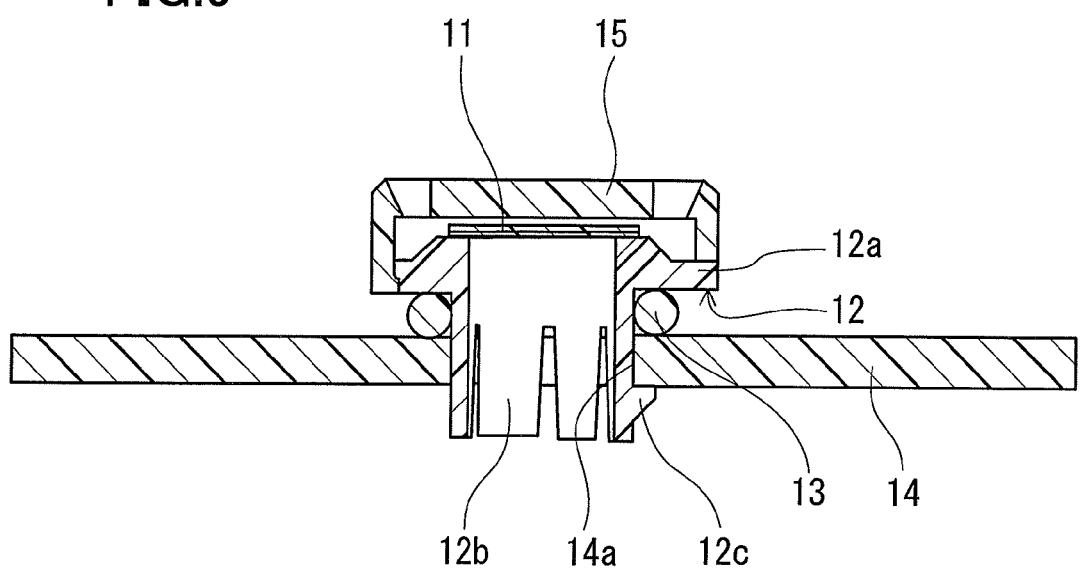
FIG. 9 is a cross-sectional view of a conventional ventilation member.

Since slide dies are used to form a conventional ventilation member, it is difficult to form a recess or a projection in the axial direction of an axial die on the part to be molded with the slide dies. Therefore, the back surface of the flange portion 12a is flat, as shown in FIG. 9. In the ventilation member 1A of the present embodiment, however, since upwardly/downwardly separable dies can be used, a recess or a projection can be formed on the back surface 31b of the main portion 31. In the conventional ventilation member, the sealing element is exposed to the outside. Therefore, when the housing equipped with the ventilation member is subjected to high-pressure washing, a direct impact from external pressure is given to the sealing element. In contrast, in the present embodiment, since the outer peripheral wall portion 35 is formed on the back surface 31b of the main portion 31, a direct impact from external pressure on the sealing element 4 can be reduced. Furthermore, since the space for accommodating the sealing element 4 can be formed within the outer peripheral wall portion 35, the thickness of the part of the support body 3 interposed between the housing 6 and the gas permeable membrane 2 can be reduced.

In addition, in the present embodiment, since the side wall portion 52 extends beyond the gas permeable membrane 2 in the direction toward the support body 3, a direct impact from external pressure on the gas permeable membrane 2 also can be reduced.

As described above, the present embodiment provides a thin ventilation member 1A in which the gas permeable membrane 2 and the sealing element 4 are less susceptible to direct impacts from external pressure and foreign substances. This ventilation member 1A is particularly useful as a ventilation member for an automobile, in which durability for high-pressure washing, further reduction in thickness, etc. are required.

The recess 38 can be omitted so that the through-holes 37 are closed directly by the gas permeable membrane 2. However, if all of the through-holes 37 open to the bottom of the recess 38 and the space 38a facing the gas permeable membrane 2 communicates with all of the through-holes 37, as in the present embodiment, not only gas flows in and flows out smoothly through the through-holes 37, but also a large ventilation area can be obtained. As a result, good ventilation performance can be obtained.

Second Embodiment

Figure 5:
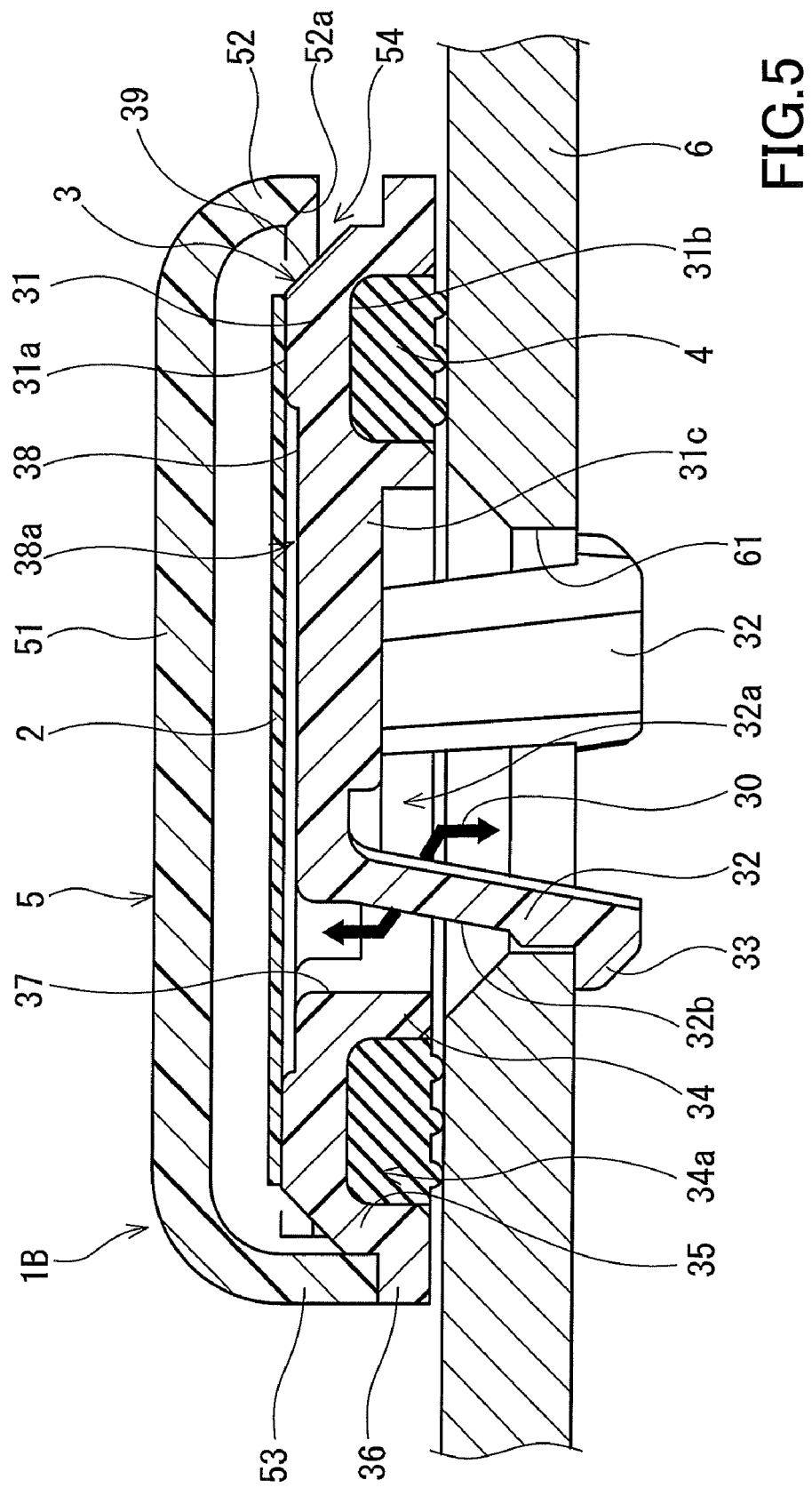
FIG. 5 is a cross-sectional view of a ventilation member according to a second embodiment of the present invention.

Next, a ventilation member 1B according to a second embodiment of the present invention will be described with reference to FIG. 5. In the second embodiment, and the third and fourth embodiments to be described later, the same reference numerals are used to designate the same parts as in the first embodiment, and the description thereof is omitted except for the particular differences.

In the ventilation member 1B of the second embodiment, an elastic element that is formed integrally with the support body 3 to be filled in the accommodation groove 34a is used as the sealing element 4. The other configuration of the second embodiment is the same as that of the first embodiment.

In order to form such an elastic element, a pre-formed elastic material may be insert-molded in the support body 3, or two-color molding may be performed using the material of the elastic element and the material of the support body 3. When the sealing element 4 that is formed integrally with the support body 3 is used, the workability for mounting the ventilation member 1B to the housing 6 can be improved. Furthermore, since the sealing element 4 can be formed into a desired shape, the thickness of the ventilation member 1B can be reduced further.

Third Embodiment

Figure 6:
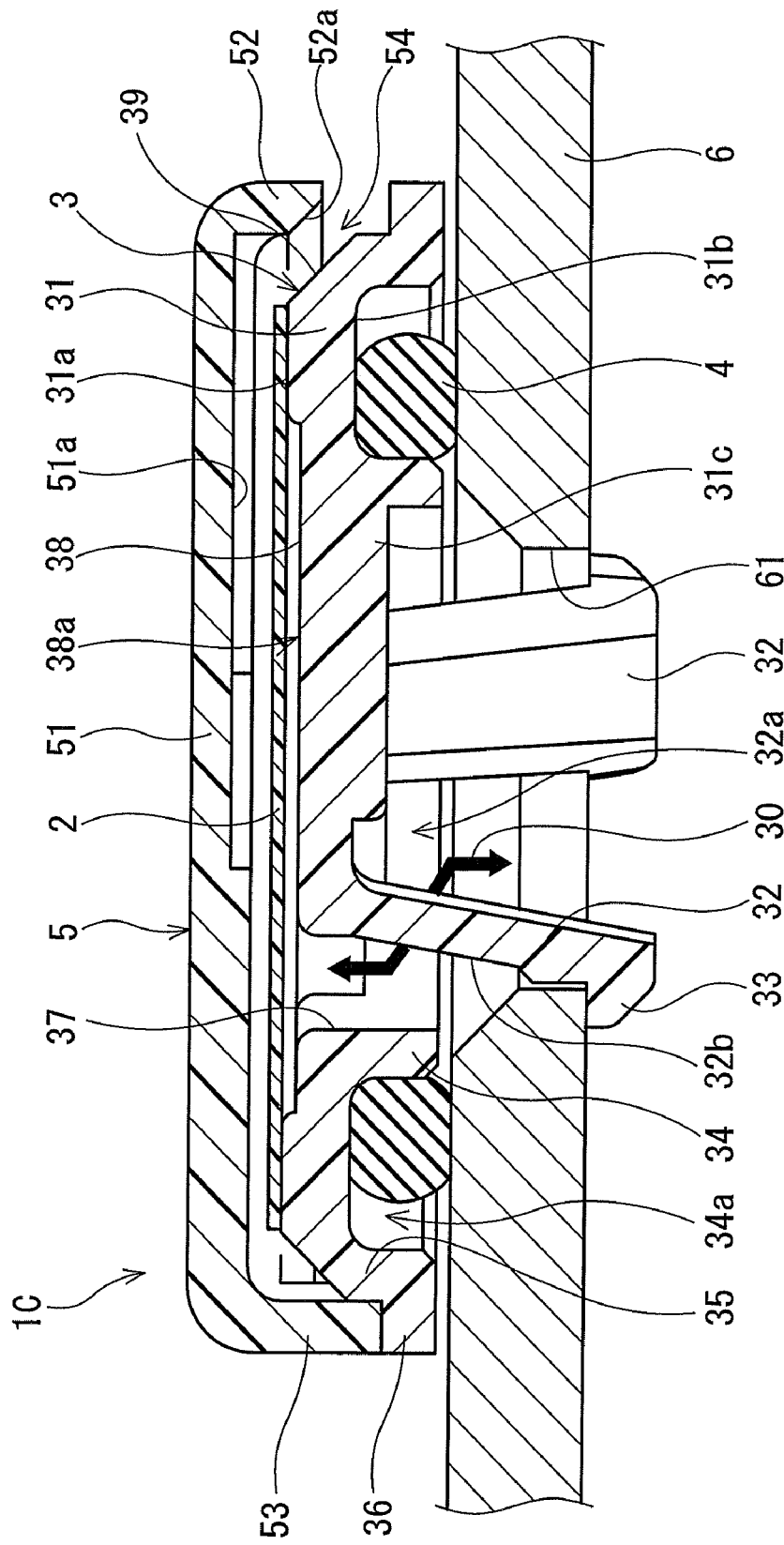
FIG. 6 is a cross-sectional view of a ventilation member according to a third embodiment of the present invention.
Figure 7:
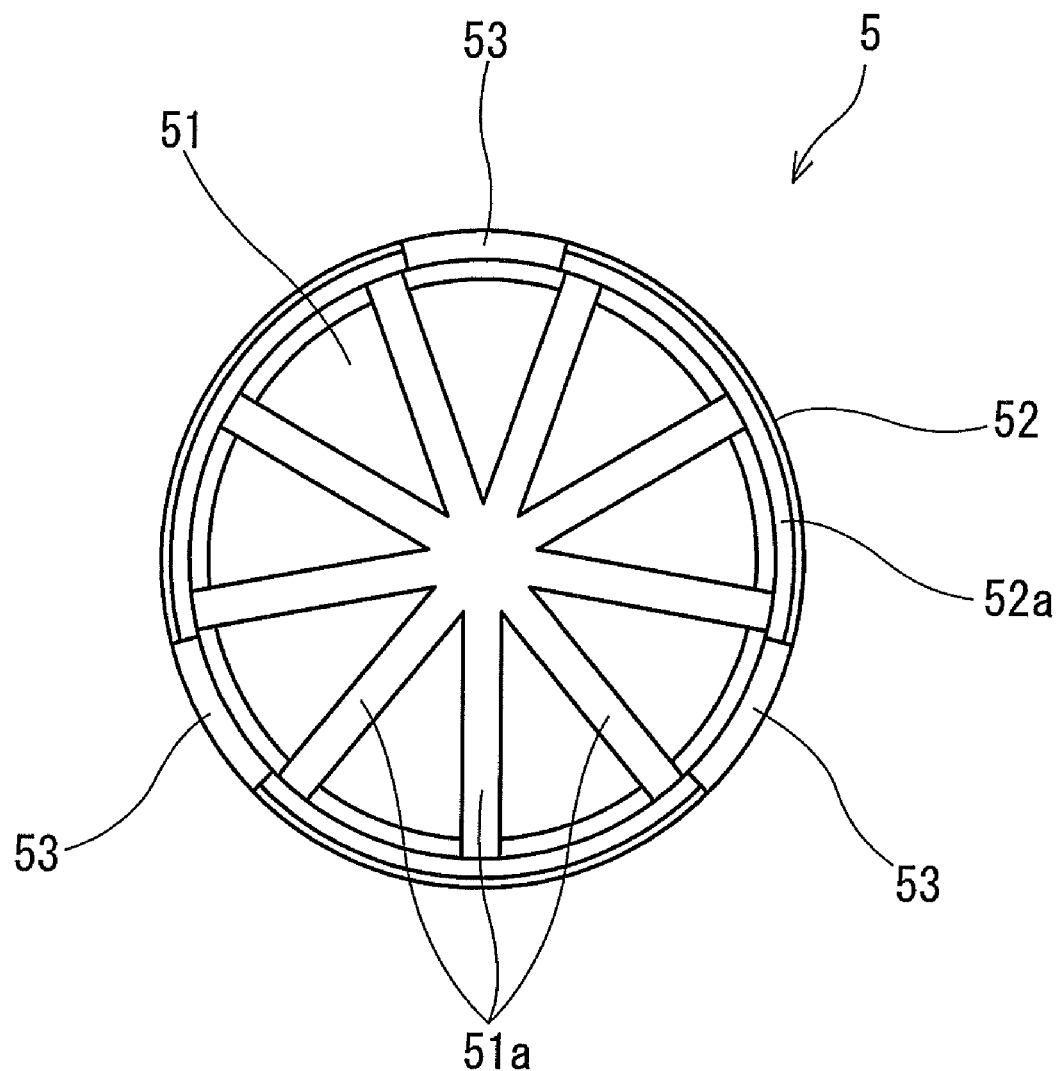
FIG. 7 is a bottom view of a cover body of the third embodiment.

As shown in FIG. 6 and FIG. 7, in a ventilation member 1C of the third embodiment, the projection height of the projecting portion 53 of the cover body 3 is reduced to increase the overlap between the side wall portion 52 and the support body 3. A plurality of grooves 51a extending radially from the center of the lower surface of the ceiling portion 51 to the side wall portion 52 are formed on the lower surface thereof. The other configuration of the third embodiment is the same as that of the first embodiment.

In this configuration, the distance between the ceiling portion 51a of the cover body 5 and the gas permeable membrane 2 is reduced, but the grooves 51a provide good ventilation. That is, according to the third embodiment, the thickness of the ventilation member 1C can be reduced further, with good ventilation.

Fourth Embodiment

Figure 8:
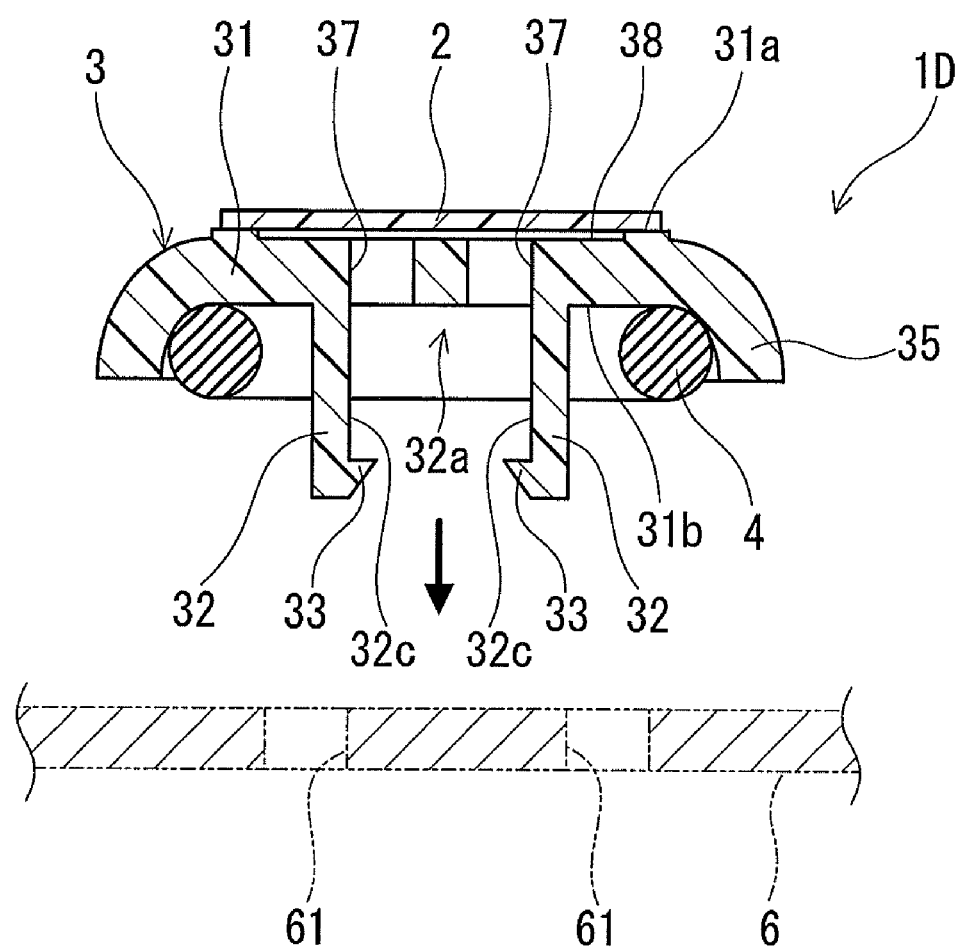
FIG. 8 is a cross-sectional view of a ventilation member according to a fourth embodiment of the present invention.

As shown in FIG. 8, in the fourth embodiment, two openings 61 are formed in the housing 6. Each of the openings 61 is a rectangular through-hole extending in the direction orthogonal to the plane of the diagram and penetrating through the housing 6 in the upward/downward direction.

In a ventilation member 1D of the fourth embodiment, a pair of leg portions 32 extending perpendicularly downwardly from the back surface 31b of the main portion 31 are provided. These leg portions 32 face each other. Each of the leg portions 32 has a rectangular cross section. At the end of each of the leg portions 32, a hook 33 projecting inwardly is formed on the inner surface 32c so that the hooks 33 face each other. In this case, the gaps 32a (the gaps formed between the ends of the leg portions 32 in the width direction thereof) formed between the leg portions 32 are two-dimensional.

The main portion 31 has, at positions corresponding to the hooks 33 in the upward/downward direction between the leg portions 32, a pair of through-holes 37 each having an inner peripheral surface extending continuously from the inner surface 32b of the leg portion 32. Each of the hooks 33 is exposed, through the through-hole 37, as seen from the side of the front surface 31a of the main portion 31. In the fourth embodiment, the inner peripheral wall portion 34 as described in the first to third embodiments is not provided. Only the outer peripheral wall portion 35 is provided.

Even in the ventilation member 1D configured in this manner, the ventilation holes 37 and the space, including the gaps 32a, facing the back surface 31b of the main portion 31 can form the ventilation passage from the openings 61 to the gas permeable membrane 2. Also in the fourth embodiment, the support body 3 can be produced using upwardly/downwardly separable dies.

The invention claimed is:

1. A ventilation member to be mounted to a housing, comprising:
a gas permeable membrane;
a support body for supporting the gas permeable membrane, the support body being configured to form a ventilation passage from an opening of the housing to the gas permeable membrane when the support body is fixed to the housing; and
a sealing element for sealing between the housing and the support body at a position surrounding the opening,
wherein the support body includes: a main portion having a front surface on which the gas permeable membrane is attached and a back surface for pressing the sealing element against the housing; and a plurality of leg portions extending from the back surface of the main portion so that the leg portions can be inserted into the opening, the leg portions each having, at its end, a hook to be caught by the housing, and
the main portion has, at positions corresponding to the hooks in a direction in which the leg portions are inserted, through-holes through which the hooks are exposed as seen from a side of the front surface of the main portion, and the through-holes and gaps between the adjacent leg portions form the ventilation passage.

2. The ventilation member according to claim 1, wherein the leg portions extend obliquely so as to spread outwardly with increasing distance from the main portion, and the hook is formed on an outer surface of the leg portion directed toward the back surface of the main portion, and the outer surface of the leg portion also is exposed through the through-hole as seen from the side of the front surface of the main portion.

3. The ventilation member according to claim 1, wherein the front surface of the main portion has, at a position surrounding the gas permeable membrane, a receding portion receding toward the back surface with increasing distance from the gas permeable membrane.

4. The ventilation member according to claim 1, wherein the support body further includes a peripheral wall portion surrounding the sealing element.

5. The ventilation member according to claim 4, wherein the support body further includes a second peripheral wall portion forming an accommodation groove for accommodating the sealing element, together with the peripheral wall portion and the main portion.

6. The ventilation member according to claim 1, wherein the front surface of the main portion has a recess for forming a space between the main portion and the gas permeable membrane, and all of the through-holes open to a bottom of the recess.

7. The ventilation member according to claim 1, further comprising a cover body for covering the gas permeable membrane from a side opposite to the support body,
wherein the cover body has: a ceiling portion facing the gas permeable membrane; a side wall portion extending from a peripheral portion of the ceiling portion in a direction toward the support body; and a plurality of projecting portions projecting from the side wall portion in the direction toward the support body, and
the projecting portions are fixed to the support body so as to form a gap between the side wall portion and the support body, through which a space defined inside the cover body along the gas permeable membrane communicates with an outside.

8. The ventilation member according to claim 7, wherein the side wall portion extends beyond the gas permeable membrane in the direction toward of the support body.

9. The ventilation member according to claim 7, wherein an inner peripheral surface of the side wall portion has an inclined surface on its edge located closer to the support body.

10. The ventilation member according to claim 1, wherein the gas permeable membrane includes a porous resin membrane.

11. The ventilation member according to claim 10, wherein the porous resin membrane is liquid repellent-treated.

* * * * *